(12) United States Patent
Choi et al.

(10) Patent No.: US 11,756,853 B2
(45) Date of Patent: Sep. 12, 2023

(54) SEMICONDUCTOR PACKAGE

(71) Applicant: SAMSUNG ELECTRONICS CO., LTD., Suwon-si (KR)

(72) Inventors: Dong Joo Choi, Seoul (KR); Seung Duk Baek, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/715,260

(22) Filed: Apr. 7, 2022

(65) Prior Publication Data

US 2022/0230933 A1 Jul. 21, 2022

Related U.S. Application Data

(63) Continuation of application No. 17/034,589, filed on Sep. 28, 2020, now Pat. No. 11,302,598.

(30) Foreign Application Priority Data

Feb. 7, 2020 (KR) .................. 10-2020-0014665

(51) Int. Cl.
*H01L 23/367* (2006.01)
*H01L 25/065* (2023.01)

(52) U.S. Cl.
CPC ........ *H01L 23/367* (2013.01); *H01L 25/0657* (2013.01)

(58) Field of Classification Search
CPC ......... H01L 27/14629; H01L 27/14609; H01L 27/14621; H01L 27/14636
See application file for complete search history.

(56) References Cited

U.S. PATENT DOCUMENTS

| | | | |
|---|---|---|---|
| 6,936,919 B2 | 8/2005 | Chuang et al. | |
| 7,031,162 B2 | 4/2006 | Arvelo et al. | |
| 7,250,676 B2 | 7/2007 | Wang | |
| 7,446,409 B2 | 11/2008 | Yang | |
| 9,269,694 B2 | 2/2016 | Chen et al. | |
| 2009/0001367 A1* | 1/2009 | Baek .................. | H01L 25/0657 257/734 |
| 2017/0047310 A1* | 2/2017 | Shim .................. | H01L 23/544 |
| 2019/0198489 A1 | 6/2019 | Kim et al. | |

(Continued)

FOREIGN PATENT DOCUMENTS

JP 2015-146385 A 8/2015

*Primary Examiner* — Thao P Le
(74) *Attorney, Agent, or Firm* — Sughrue Mion, PLLC

(57) ABSTRACT

A semiconductor package includes a substrate, first to third semiconductor chips disposed on the substrate, first to third heat transfer components, first and second heat spreaders, and a trench. The first semiconductor chip is between the second and third semiconductor chips. The first to third heat transfer components are disposed on the semiconductor chips, respectively. The first heat spreader is formed on the first to third heat transfer components. The second heat spreader protrudes from the first heat spreader. The trench is formed on the second heat spreader. The second heat spreader includes first and second side units spaced apart with the trench between. A distance between an outer surface of an uppermost part of the first side unit and an outer surface of an uppermost part of the second side unit is smaller than a width of an upper surface of the first semiconductor chip.

20 Claims, 13 Drawing Sheets

(56) References Cited

U.S. PATENT DOCUMENTS

| | | | |
|---|---|---|---|
| 2020/0013753 A1* | 1/2020 | Kim | H01L 25/0657 |
| 2021/0118770 A1 | 4/2021 | Kuo et al. | |
| 2021/0143077 A1 | 5/2021 | Yeh | |
| 2021/0257275 A1 | 8/2021 | Park et al. | |
| 2021/0280530 A1 | 9/2021 | Chen et al. | |
| 2021/0358866 A1 | 11/2021 | Choi | |
| 2021/0384100 A1* | 12/2021 | Ryu | H01L 24/29 |
| 2021/0384162 A1* | 12/2021 | Choi | H01L 24/06 |
| 2021/0398916 A1* | 12/2021 | Kim | H01L 25/0655 |
| 2022/0302087 A1* | 9/2022 | Choi | H01L 21/6835 |
| 2022/0359358 A1* | 11/2022 | Kim | H01L 23/3107 |
| 2022/0415835 A1* | 12/2022 | Bae | H01L 24/03 |
| 2023/0082884 A1* | 3/2023 | Ko | H01L 24/73 |
| | | | 257/113 |
| 2023/0089399 A1* | 3/2023 | Song | H01L 23/49827 |
| | | | 257/774 |
| 2023/0113726 A1* | 4/2023 | Kwak | H01L 23/3128 |
| | | | 257/696 |

* cited by examiner

SEMICONDUCTOR PACKAGE

This application is a Continuation application of U.S. application Ser. No. 17/034,589 filed on Sep. 28, 2020, which claims priority from Korean Patent Application No. 10-2020-0014665 filed on Feb. 7, 2020 in the Korean Intellectual Property Office, the disclosures of each of which are incorporated by reference herein in their entireties.

BACKGROUND

1. Field

The present disclosure relates to a semiconductor package including a heat spreader.

2. Description of the Related Art

Recently, with a requirement for implementation of high-performance semiconductor chips, the size of semiconductor chips has increased and the size of semiconductor packages has increased accordingly. On the other hand, the thickness of the semiconductor package has been rather reduced according to the tendency of slimness of an electronic device.

On the other hand, the semiconductor package is developed in a direction that satisfies demands for multi-functionality, high capacity, and miniaturization. For this reason, by integrating a plurality of semiconductor chips into one semiconductor package, it has become possible to provide a semiconductor package having a high capacity and multi-functionality, while significantly reducing the size of the semiconductor package.

In particular, in order to achieve the high capacity, more semiconductor chips need to be stacked than before. In this case, since an overall thickness of the semiconductor chip increases, a difference in thickness occurs between the semiconductor chip and an adjacent logic chip, and the heat dissipation characteristics of the semiconductor package are degraded.

Therefore, there is a need to effectively dissipate heat generated from the semiconductor chip.

SUMMARY

It is an aspect to provide a semiconductor package that effectively controls heat generated from a semiconductor chip.

It is another aspect to provide a semiconductor package with improved product reliability.

According to an aspect of an embodiment, there is provided a semiconductor device comprising a substrate including a first surface and a second surface facing each other; a first semiconductor chip and a second semiconductor chip disposed on the first surface of the substrate; a first heat spreader formed on the first semiconductor chip and the second semiconductor chip; and a second heat spreader which protrudes from the first heat spreader and covers the first semiconductor chip, wherein the first semiconductor chip includes a first side wall extending in a first direction, the second semiconductor chip includes a second side wall extending in the first direction and facing the first side wall of the first semiconductor chip in a second direction intersecting the first direction, and an area of the second heat spreader at a boundary between the first heat spreader and the second heat spreader is smaller than or equal to an area of an upper surface of the first semiconductor chip.

According to another aspect of an embodiment, there is provided a semiconductor package comprising a substrate including a first surface and a second surface facing each other; a first semiconductor chip disposed on the first surface of the substrate; a second semiconductor chip and a third semiconductor chip disposed on the first surface of the substrate with the first semiconductor chip interposed therebetween; a first heat spreader formed on the first semiconductor chip, the second semiconductor chip and the third semiconductor chip; and a second heat spreader which protrudes from the first heat spreader and covers an upper surface of the first semiconductor chip, wherein the first semiconductor chip includes a first side wall and a second side wall extending in a first direction, the first side wall and the second side wall being on opposite sides of the first semiconductor chip in a second direction intersecting the first direction, the second semiconductor chip includes a third side wall facing the first side wall of the first semiconductor chip, the third semiconductor chip includes a fourth side wall facing the second side wall of the first semiconductor chip, and at a boundary between the first heat spreader and the second heat spreader, a width of the second heat spreader in the second direction is smaller than a distance between the third side wall of the second semiconductor chip and the fourth side wall of the third semiconductor chip.

According to another aspect of an embodiment, there is provided a semiconductor package comprising a substrate; a heat spreader on the substrate, a packaging space being defined between the substrate and the heat spreader; a first connection terminal disposed on the substrate inside the packaging space; an interposer substrate disposed on the first connection terminal inside the packaging space; a second connection terminal disposed on the interposer substrate; a first semiconductor chip disposed on the second connection terminal; a second semiconductor chip and a third semiconductor chip disposed on the second connection terminal with the first semiconductor chip interposed therebetween; a first heat transfer component disposed on the first semiconductor chip; a second heat transfer component disposed on the second semiconductor chip; and a third heat transfer component disposed on the third semiconductor chip, wherein the first semiconductor chip includes a first side wall and a second side wall extending in a first direction and on opposite sides of the first semiconductor chip in a second direction intersecting the first direction, the second semiconductor chip includes a third side wall facing the first side wall of the first semiconductor chip, the third semiconductor chip includes a fourth side wall facing the second side wall of the first semiconductor chip, the first side wall and the third side wall are spaced apart from each other, the second side wall and the fourth side wall are spaced apart from each other, the heat spreader surrounding the packaging space, and including a first heat spreader formed on the first heat transfer component, the second heat transfer component, and the third heat transfer component, a second heat spreader protruding from the first heat spreader and covering an upper part of the first heat transfer component, and a third heat spreader and a fourth heat spreader each extending from the first heat spreader to a surface of the substrate, a width of the second heat spreader in the second direction at a boundary between the first heat spreader and the second heat spreader is smaller than a distance between the third side wall of the second semiconductor chip and the fourth side wall of the third semiconductor chip, and the third heat spreader and the fourth heat spreader are each spaced apart from the first to third semiconductor chips and an outer wall of the interposer substrate.

According to another aspect of an embodiment, there is provided a semiconductor package comprising a substrate; a first semiconductor chip, a second semiconductor chip, and a third semiconductor chip disposed on the substrate, the first semiconductor chip being disposed between the second semiconductor chip and the third semiconductor chip; a first heat transfer component, a second heat transfer component and a third heat transfer component disposed on the first semiconductor chip, the second semiconductor chip, and the third semiconductor chip, respectively; and a first heat spreader formed on the first heat transfer component, the second heat transfer component and the third heat transfer component and directly contacting the second heat transfer component and the third heat transfer component; and a second heat spreader which protrudes from the first heat spreader and directly contacts the first heat transfer component, wherein the second heat spreader is spaced apart from the second semiconductor chip and the second heat transfer component, and from the third semiconductor chip and the third heat transfer component.

BRIEF DESCRIPTION OF THE DRAWINGS

The above and other aspects will become more apparent by describing in detail exemplary embodiments thereof with reference to the attached drawings, in which.

DETAILED DESCRIPTION

Aspects are not restricted to the ones set forth herein. The above and other aspects will become more apparent to one of ordinary skill in the art by referencing the detailed description given below.

Specific details of various embodiments are included in the detailed description and drawings.

Hereinafter, various embodiments will be described with reference to the attached drawings.

Hereinafter, a semiconductor package will be described with reference to FIGS. 1 to 13.

A semiconductor package according to some embodiments will be described with reference to FIGS. 1 to 3.

Figure 1:
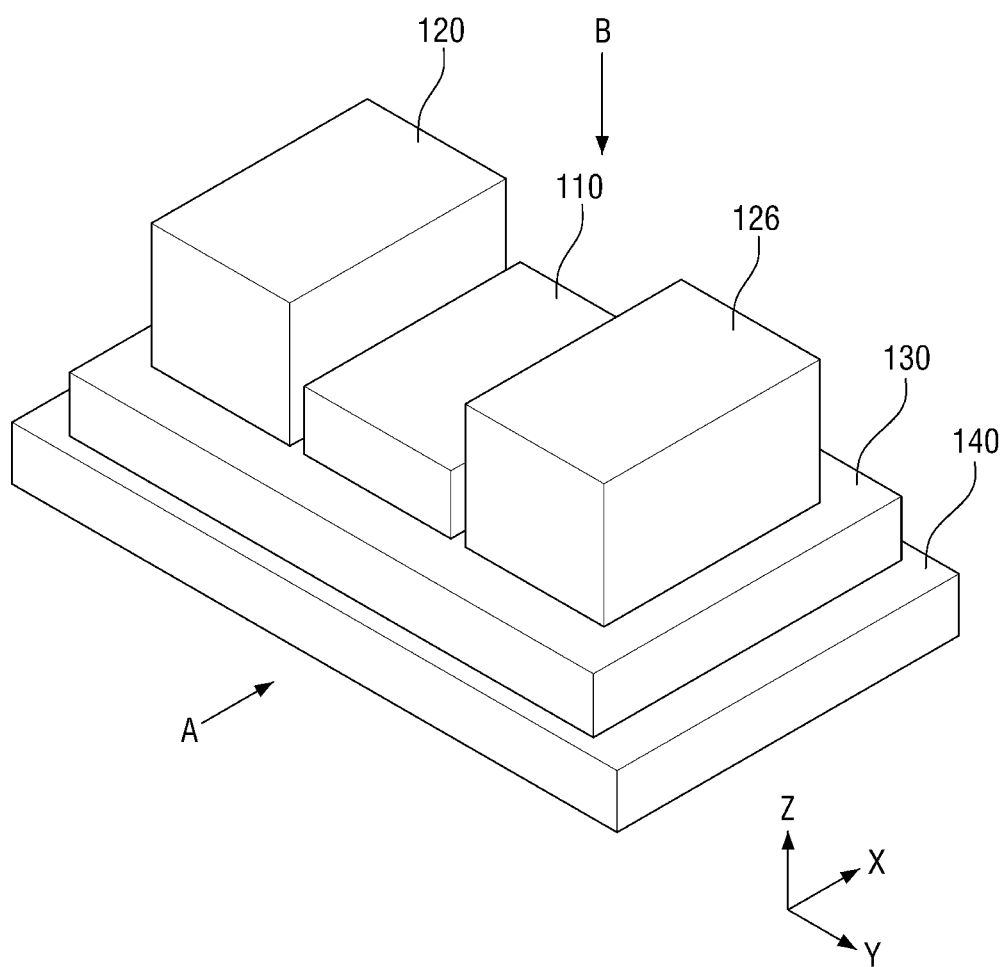
FIG. 1 is a perspective view of the semiconductor package according to some embodiments.

FIG. 1 is a perspective view of the semiconductor package according to some embodiments. FIG. 2 is a side view of the semiconductor package of FIG. 1 as viewed in a direction A in FIG. 1. FIG. 3 is a top view of the semiconductor package of FIG. 1 as viewed in a direction B in FIG. 1.

Figure 2:
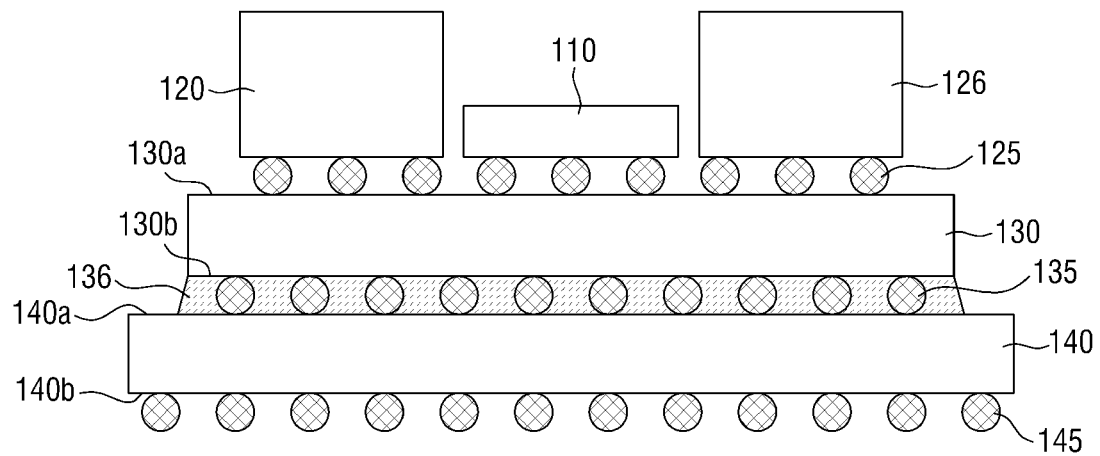
FIG. 2 is a side view of the semiconductor package of FIG. 1 as viewed in a direction A in FIG. 1.

Referring to FIGS. 1 and 2, a semiconductor package according to some embodiments may include a first semiconductor chip 110, a second semiconductor chip 120, a third semiconductor chip 126, a first substrate 130, a second substrate 140, a first connection terminal 125, a second connection terminal 135, a third connection terminal 145, and an underfill material 136.

The first substrate 130 may include an interposer substrate. For example, the first substrate 130 may include FR4, polyimide, silicon, glass, or the like.

The first substrate 130 may include a first surface 130a and a second surface 130b facing each other.

The first connection terminal 125 may be disposed on the first surface 130a. The first connection terminal 125 may include, but is not limited to, a plurality of solder balls or a plurality of conductive bumps.

The first connection terminal 125 may be disposed on one side of the first semiconductor chip 110, one side of the second semiconductor chip 120, and one side of the third semiconductor chip 126. The first semiconductor chip 110, the second semiconductor chip 120, and the third semiconductor chip 126 may be electrically connected to the first substrate 130 through the first connection terminal 125.

The second connection terminal 135 may be disposed on the second surface 130b. The second connection terminal 135 may include, but is not limited to, a plurality of solder balls or a plurality of conductive bumps.

The second substrate 140 may include a package substrate. For example, the second substrate 140 may include a printed circuit board (PCB), a ceramic substrate or the like. Although the second substrate 140 may be larger in size than the first substrate 130, embodiments are not limited thereto. In some embodiments, the second substrate 140 may be equal to or smaller in size than the first substrate 130.

The second substrate 140 may include a plurality of insulating films and an internal wiring layer. The second substrate 140 may include a first surface 140a and a second surface 140b facing each other. The second substrate 140 may be disposed below the first substrate 130. That is, the second substrate 140 may be disposed on the second surface 130b of the first substrate 130. That is to say, the second substrate 140 may be disposed below the second connection terminal 135, such that the second connection terminal 135 may be disposed between the first substrate 130 and the second substrate 140, as illustrated in FIG. 2. The second connection terminal 135 may be disposed on the first surface 140a of the second substrate 140.

The third connection terminal 145 may be disposed on the second surface 140b of the second substrate 140. For example, the third connection terminal 145 may be a plurality of conductive balls or a plurality of solder balls. The semiconductor package may be electrically connected to an external device through the third connection terminal 145.

The second substrate 140 and the first substrate 130 may be electrically connected to each other through the second connection terminal 135. The underfill material 136 may fill a space between the adjacent second connection terminals 135. The underfill material 136 may protect the second connection terminal 135.

The underfill material 136 may include, for example, an epoxy-based resin, benzocyclobutyne or polyimide. However, the embodiments are not limited thereto. For example, in some embodiments, the underfill material 136 may further include a silica filler. In another example, in some embodiments, the underfill material 136 may include an adhesive and a flux. The flux may include an oxide film remover. In still another example, in some embodiments, the underfill material 136 may include a silica filler or a flux. In still another example, in some embodiments, the underfill material 136 may include anon-conductive paste.

The first connection terminal 125, the second connection terminal 135, and the third connection terminal 145 may have different sizes from those shown in FIG. 2. For example, in some embodiments, the size of the second connection terminal 135 may be greater than the size of the first connection terminal 125. For example, in some embodiments, the size of the third connection terminal 145 may be greater than the size of the second connection terminal 135. However, embodiments are not limited thereto.

In addition, the numbers of the first connection terminal 125, the second connection terminal 135, and the third connection terminal 145 shown in FIG. 2 are merely for convenience of explanation, and embodiments are not limited thereto.

The first semiconductor chip 110 may be a logic chip. The second semiconductor chip 120 and the third semiconductor chip 126 may be memory chips.

The logic chip may be, for example, a central processing unit (CPU), a controller, an application specific integrated circuit (ASIC) or the like. The memory chip may be, for example, a volatile memory chip such as a dynamic random access memory (DRAM) or a static RAM (SRAM), or a non-volatile memory chip such as a phase-change RAM (PRAM), a magneto resistive RAM (MRAM), a ferroelectric RAM (FeRAM) or a resistive RAM (RRAM).

The second semiconductor chip 120 and the third semiconductor chip 126 may be a high bandwidth memory (HBM) in which a plurality of DRAM memory chips are stacked. As an example, in some embodiments, the second semiconductor chip 120 and the third semiconductor chip 126 may include four stacked DRAM memory chips. As an example, in some embodiments, the second semiconductor chip 120 and the third semiconductor chip 126 may include eight stacked DRAM memory chips. As an example, in some embodiments, the second semiconductor chip 120 and the third semiconductor chip 126 may include twelve stacked DRAM memory chips. As an example, in some embodiments, the second semiconductor chip 120 and the third semiconductor chip 126 may include sixteen stacked DRAM memory chips. However, embodiments are not limited thereto and the number of stacked DRAM memory chips may be different than these examples.

The second semiconductor chip 120 and the third semiconductor chip 126 may be a hybrid memory chip (HMC).

Heights of the second semiconductor chip 120 and the third semiconductor chip 126 may be higher than a height of the first semiconductor chip 110. That is, since the plurality of DRAM memory chips are stacked, the heights of the second semiconductor chip 120 and the third semiconductor chip 126 may be higher than the height of the first semiconductor chip 110.

The first semiconductor chip 110, the second semiconductor chip 120, and the third semiconductor chip 126 may be disposed on the first substrate 130. That is, the first semiconductor chip 110 may be disposed on a first group of the first connection terminals 125. Further, the second semiconductor chip 120 may be disposed on a second group of the first connection terminals 125 different from the first group. Further, the third semiconductor chip 126 may be disposed on a third group of first connection terminal 125 different from the first group and the second group.

Referring to FIG. 1, the first semiconductor chip 110, the second semiconductor chip 120, and the third semiconductor chip 126 may extend in a first direction X. Although the first semiconductor chip 110, the second semiconductor chip 120, and the third semiconductor chip 126 may have a rectangular parallelepiped shape as illustrated in FIG. 1, this shape is merely for convenience of description, and embodiments are not limited thereto. The first semiconductor chip 110, the second semiconductor chip 120, and the third semiconductor chip 126 may have a shape in which surfaces formed in the first direction X and a second direction Y extend in a third direction Z.

The first semiconductor chip 110 may be disposed between the second semiconductor chip 120 and the third semiconductor chip 126. For example, the first semiconductor chip 110, the second semiconductor chip 120 and the third semiconductor chip 126 may be arranged side by side in the second direction Y.

Figure 3:
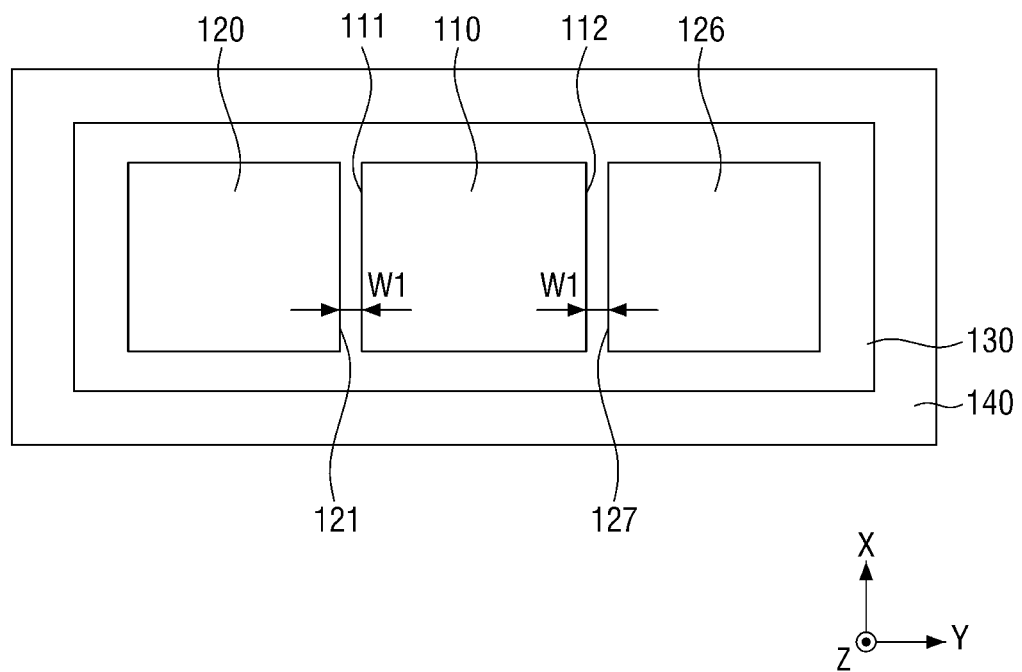
FIG. 3 is a top view of the semiconductor package of FIG. 1 as viewed in a direction B in FIG. 1.

Referring to FIG. 3, the first semiconductor chip 110 may include a first side wall 111 and a second side wall 112 on opposite sides of the first semiconductor chip 110 in the second direction Y. The second semiconductor chip 120 may include a third side wall 121 facing the first side wall 111. The third semiconductor chip 126 may include a fourth side wall 127 facing the second side wall 112.

The first side wall 111 of the first semiconductor chip 110 and the third side wall 121 of the second semiconductor chip 120 may be spaced apart from each other by a first width W1. The second side wall 112 of the first semiconductor chip 110 and the fourth side wall 127 of the third semiconductor chip 126 may be spaced apart from each other by the first width W1. Although FIG. 3 shows that an interval between the first side wall 111 and the third side wall 121 is the same as an interval between the second side wall 112 and the fourth side wall 127, embodiments are not limited thereto, and in some embodiments, the interval may be different. That is, in some embodiments, a width between the first side wall 111 of the first semiconductor chip 110 and the third side wall 121 of the second semiconductor chip 120 may be different from a width between the second side wall 112 of the first semiconductor chip 110 and the fourth side wall 127 of the third semiconductor chip 126.

The first width W1 may be 200 μm or less. However, embodiments are not limited thereto. In some embodiments, the first width W1 may be 150 μm or less.

A semiconductor package including a heat transfer component will be described with reference to FIGS. 4 and 5.

Figure 4:
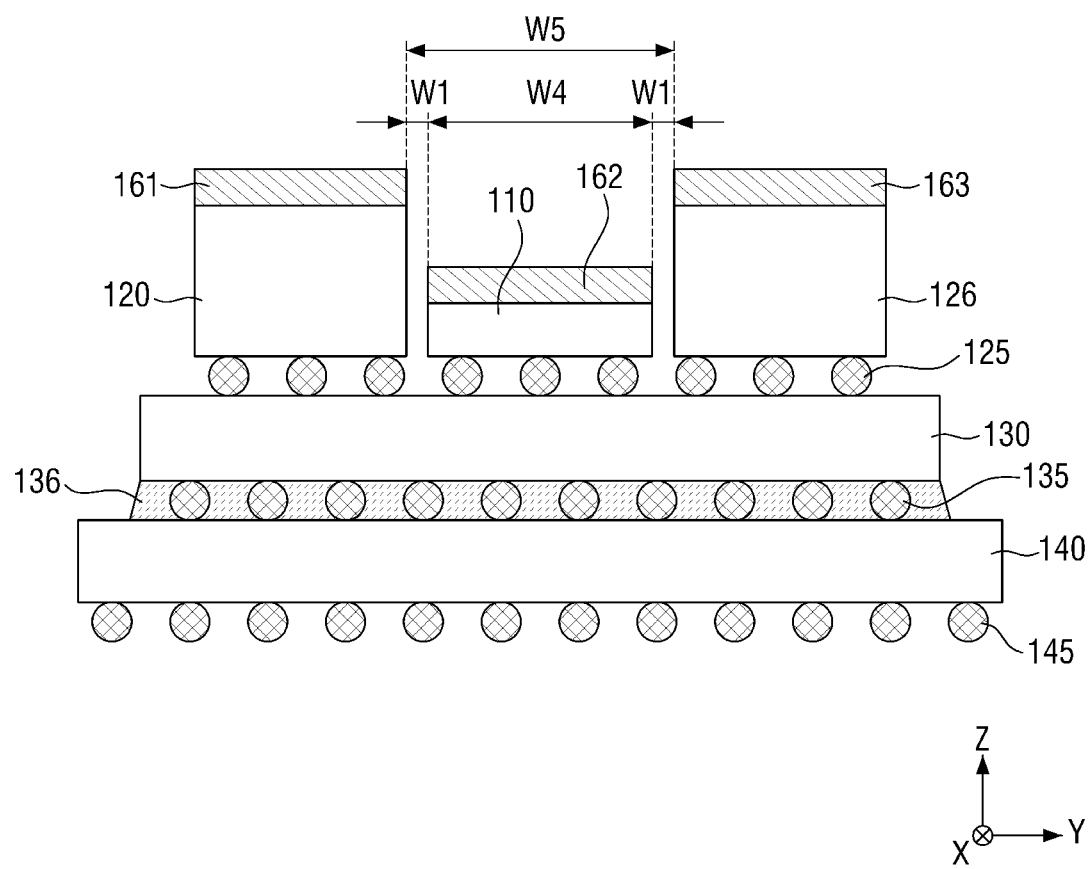
FIG. 4 is a side view of a semiconductor package according to some embodiments.

FIG. 4 is a side view of a semiconductor package according to some embodiments. FIG. 5 is a top view of the semiconductor package according to some embodiments.

Figure 5:
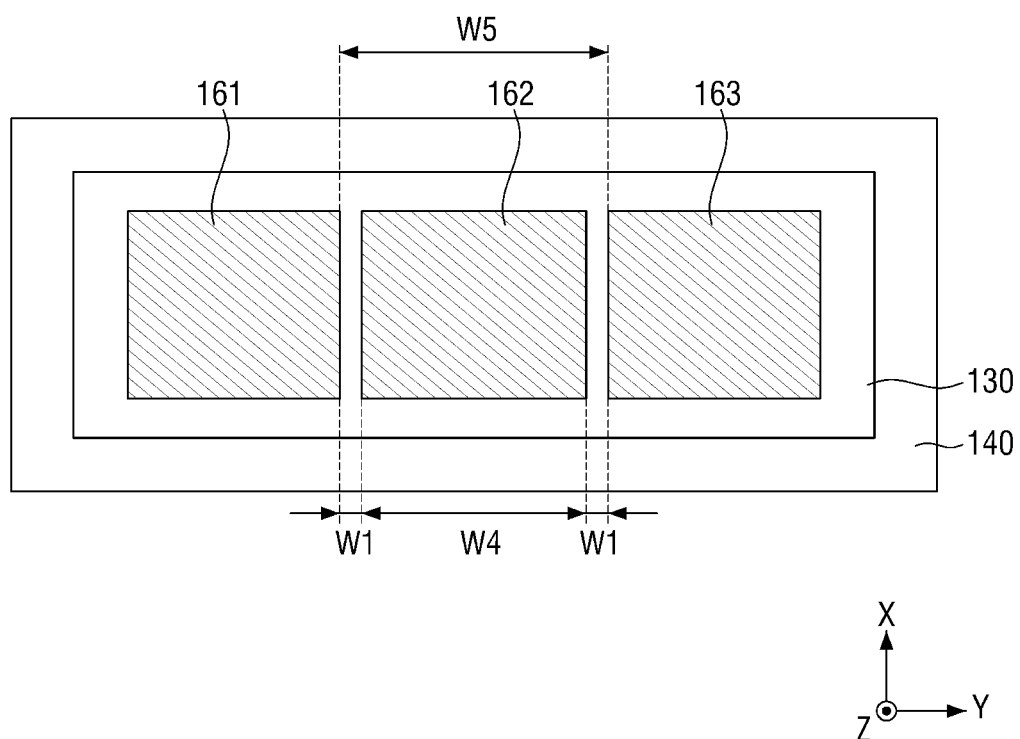
FIG. 5 is a top view of the semiconductor package according to some embodiments.

Referring to FIGS. 4 and 5, a semiconductor package according to some embodiments may include a first heat transfer component 161, a second heat transfer component 162, and a third heat transfer component 163.

The first heat transfer component 161 may be disposed on the second semiconductor chip 120. The second heat transfer component 162 may be disposed on the first semiconductor chip 110. The third heat transfer component 163 may be disposed on the third semiconductor chip 126.

Since the first semiconductor chip 110, the second semiconductor chip 120, and the third semiconductor chip 126 come into contact with the first heat transfer component 161, the second heat transfer component 162, and the third heat transfer component 163, respectively, heat generated from the first semiconductor chip 110, the second semiconductor chip 120, and the third semiconductor chip 126 may easily escape to the outside of the semiconductor package through the first heat transfer component 161, the second heat transfer component 162 and the third heat transfer component 163. Therefore, the semiconductor package according to some embodiments may be improved in reliability and operating performance.

The first heat transfer component 161, the second heat transfer component 162, and the third heat transfer component 163 may be a thermal interface material (TIM).

The first heat transfer component 161, the second heat transfer component 162, and the third heat transfer component 163 may include a material having high heat conductivity. In some embodiments, the first heat transfer component 161, the second heat transfer component 162, and the third heat transfer component 163 may include, for example, at least one metal material of silver (Ag), aluminum (Al), copper (Cu), platinum (Pt), zinc (Zn), nickel (Ni), and iron (Fe), or an alloy of these metal materials. However, embodiments are not limited to these materials. In some embodiments, the first heat transfer component 161, the second heat transfer component 162, and the third heat transfer component 163 may include copper (Cu).

Referring to FIGS. 4 and 5, the second heat transfer component 162 may have a fourth width W4 in the second direction Y. Further, the first semiconductor chip 110 may have the fourth width W4 in the second direction Y. Although FIGS. 4-5 show that the width of the second heat transfer component 162 in the second direction Y and the width of the first semiconductor chip 110 in the second direction Y are equal to the fourth width W4, embodiments are not limited thereto, and in some embodiments, the width of the second heat transfer component 162 in the second direction Y may be different from the width of the first semiconductor chip 110 in the second direction Y.

A distance between an inner side wall of the first heat transfer component 161 in the second direction Y and an inner side wall of the third heat transfer component 163 in a direction opposite to the second direction Y may be a fifth width W5, as illustrated in FIG. 4. Referring to FIGS. 3 and 5, a distance between the third side wall 121 of the second semiconductor chip 120 and the fourth side wall 127 of the third semiconductor chip 126 may be a fifth width W5. Although the distance between the inner side wall of the first heat transfer component 161 in the second direction Y and the inner side wall of the third heat transfer component 163 in the direction opposite to the second direction Y, and the distance between the third side wall 121 of the second semiconductor chip 120 and the fourth side wall 127 of the third semiconductor chip 126 may be the same as the fifth width W5, embodiments are not limited thereto.

Figure 6:
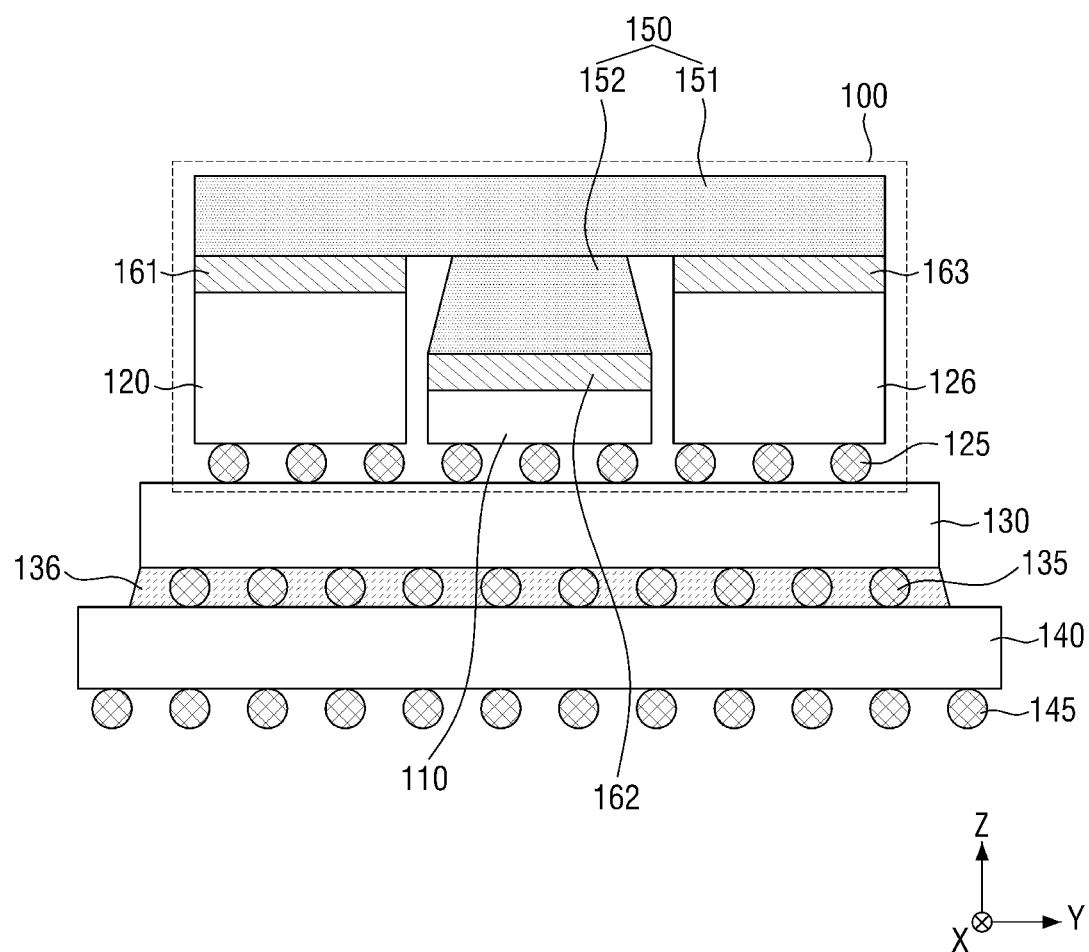
FIG. 6 is a side view of a semiconductor package according to some embodiments.
Figure 7:
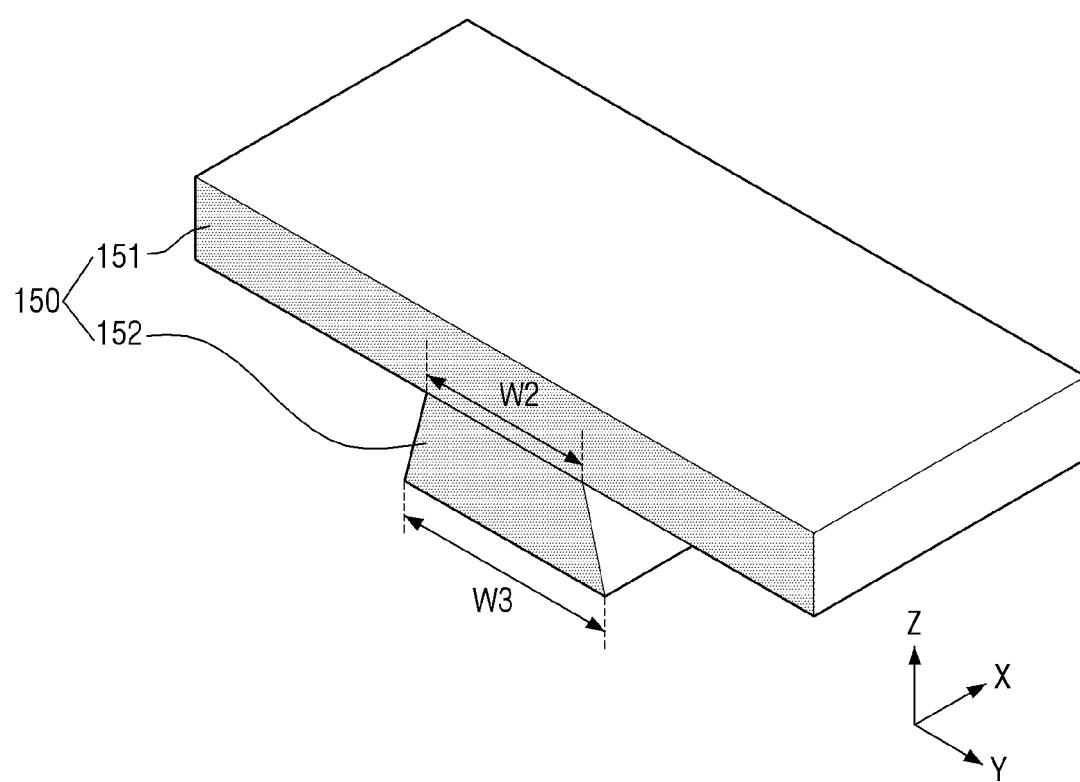
FIG. 7 is a perspective view of a heat spreader according to some embodiments.

A semiconductor package including a heat spreader will be described with reference to FIGS. 6 and 7. FIG. 6 is a side view of a semiconductor package according to some embodiments. FIG. 7 is a perspective view of a heat spreader according to some embodiments.

Referring to FIG. 7, a heat spreader 150 may include a first heat spreader 151 and a second heat spreader 152. Although the first heat spreader 151 may have a rectangular parallelepiped shape as shown in FIG. 7, embodiments are not limited thereto, and in some embodiments the first heat spreader 151 may have other shapes. For example, in some embodiments, the first heat spreader 151 may have a cylindrical shape.

The second heat spreader 152 may have a shape protruding from a lower surface of the first heat spreader 151. Although FIG. 7 shows that the second heat spreader 152 has a trapezoidal shape having a narrow upper area and a wide lower area, embodiments are not limited thereto, and in some embodiments, the second heat spreader 152 may have other shapes. For example, in some embodiments, the second heat spreader 152 may have a trapezoidal shape having a wide upper area and a narrow lower area, and in some embodiments, the second heat spreader 152 may have a shape having the same upper and lower areas.

A width in the second direction Y of an interface between the first heat spreader 151 and the second heat spreader 152 may be a second width W2. A width of a lower surface of the second heat spreader 152 in the second direction Y may be a third width W3. Although FIG. 7 shows that the second width W2 is smaller than the third width W3, embodiments are not limited thereto.

Referring to FIG. 6, the heat spreader 150 may be located above the first heat transfer component 161, the second heat transfer component 162, and the third heat transfer component 163. Further, the heat spreader 150 may be located above the first semiconductor chip 110, the second semiconductor chip 120, and the third semiconductor chip 126.

The first heat spreader 151 may cover the first heat transfer component 161. That is, the first heat spreader 151 may be in direct contact with the first heat transfer component 161. Since an area of the first heat transfer component 161 shown in FIG. 5 is covered, the first heat spreader 151 may also cover the second semiconductor chip 120.

The first heat spreader 151 may cover the third heat transfer component 163. That is, the first heat spreader 151 may be in direct contact with the third heat transfer component 163. Since an area of the third heat transfer component 163 shown in FIG. 5 is covered, the first heat spreader 151 may also cover the third semiconductor chip 126.

The first heat spreader 151 may cover the second heat transfer component 162. The first heat spreader 151 may not be in direct contact with the second heat transfer component 162.

The second heat spreader 152 may protrude from the lower surface of the first heat spreader 151 and cover the second heat transfer component 162. The second heat spreader 152 may be in direct contact with the second heat transfer component 162. Further, the second heat spreader 152 may cover the first semiconductor chip 110.

Heat generated from the first semiconductor chip 110, the second semiconductor chip 120, and the third semiconductor chip 126 may be transferred to the first heat transfer component 161, the second heat transfer component 162, and the third heat transfer component 163. Heat transferred to the first heat transfer component 161, the second heat transfer component 162, and the third heat transfer component 163 may easily escape to the outside of the semiconductor package through the heat spreader 150.

Since the semiconductor package according to some embodiments may include the first heat transfer component 161, the second heat transfer component 162, the third heat transfer component 163, and the heat spreader 150, it is possible to effectively improve thermal characteristics of the semiconductor package.

The heat spreader 150 may include a metal that is a material having a higher thermal conductivity than air. For example, the heat spreader 150 may include one or more of copper (Cu), iron (Fe), nickel (Ni), cobalt (Co), tungsten (W), chromium (Cr), silver (Ag), gold (Au), platinum (Pt), tin (Sn), aluminum (Al), magnesium (Mg), silicon (Si), or zinc (Zn).

Referring to FIG. 6, a semiconductor package 100 may include the first semiconductor chip 110, the second semiconductor chip 120, the third semiconductor chip 126, the first heat transfer component 161, the second heat transfer component 162, the third heat transfer component 163, the heat spreader 150, and the first connection terminal 125. That is, the semiconductor package 100 may have a shape in which the first semiconductor chip 110, the second semiconductor chip 120, and the third semiconductor chip 126 are disposed on the first connection terminal 125, the first heat transfer component 161, the second heat transfer component 162, and the third heat transfer component 163 are disposed on the first semiconductor chip 110, the second semiconductor chip 120, and the third semiconductor chip 126, and the heat spreader 150 is disposed on the first heat transfer component 161, the second heat transfer component 162, and the third heat transfer component 163, as described above.

Hereinafter, various embodiments of the semiconductor package 100 will be described in more detail with reference to FIGS. 8 to 11.

Figure 8:
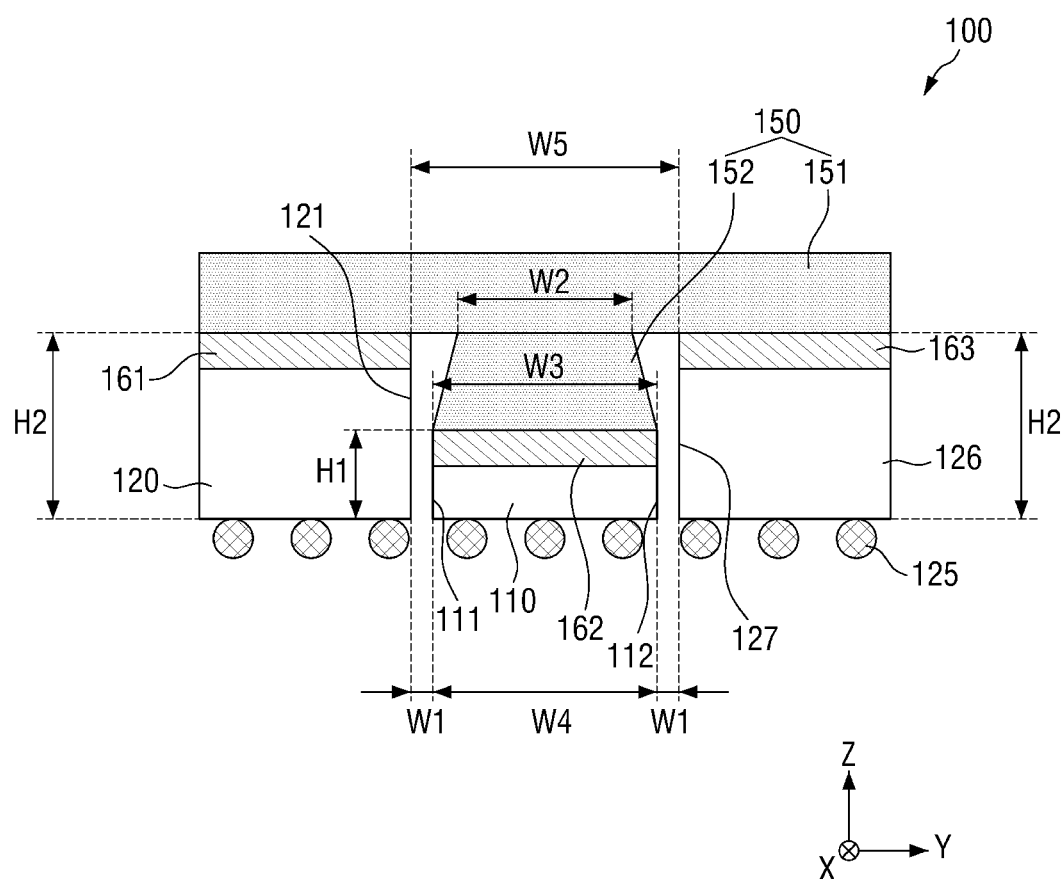
FIG. 8 is a side view of a semiconductor package according to some embodiments.
Figure 9:
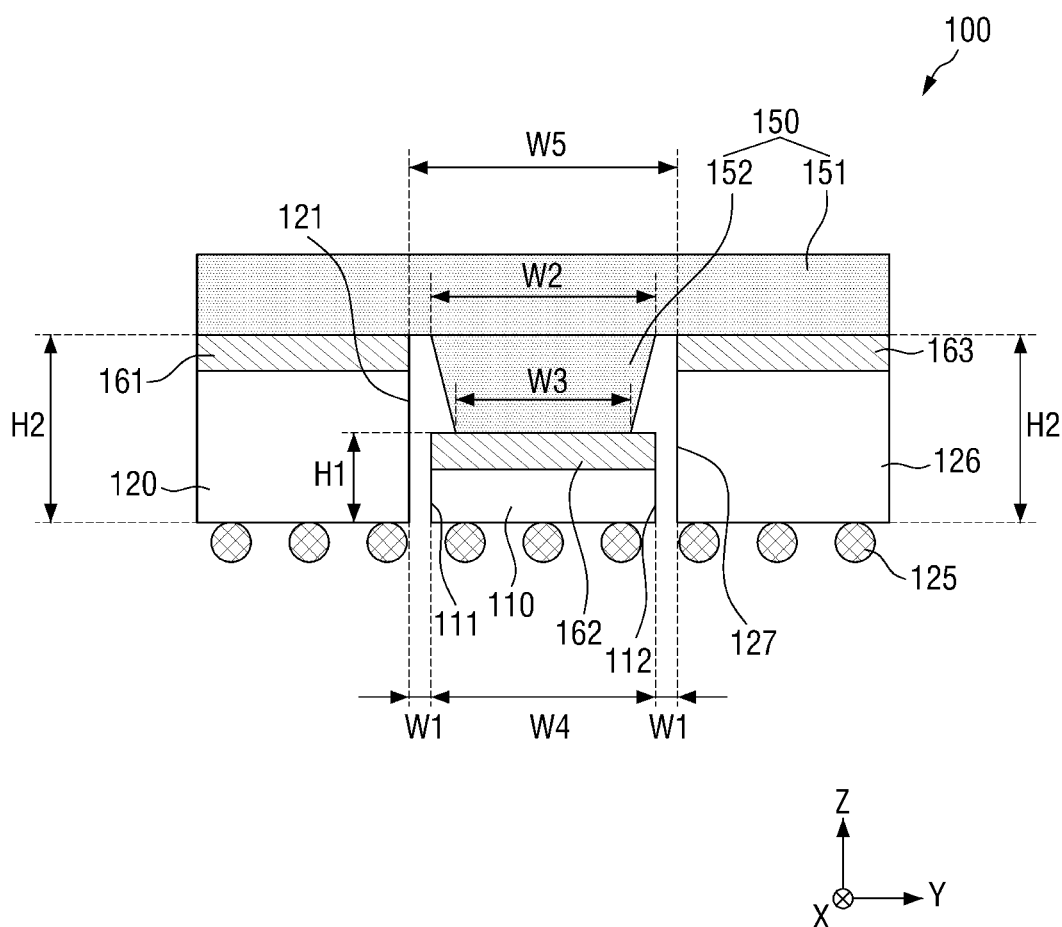
FIG. 9 is a side view of the semiconductor package according to some embodiments.
Figure 10:
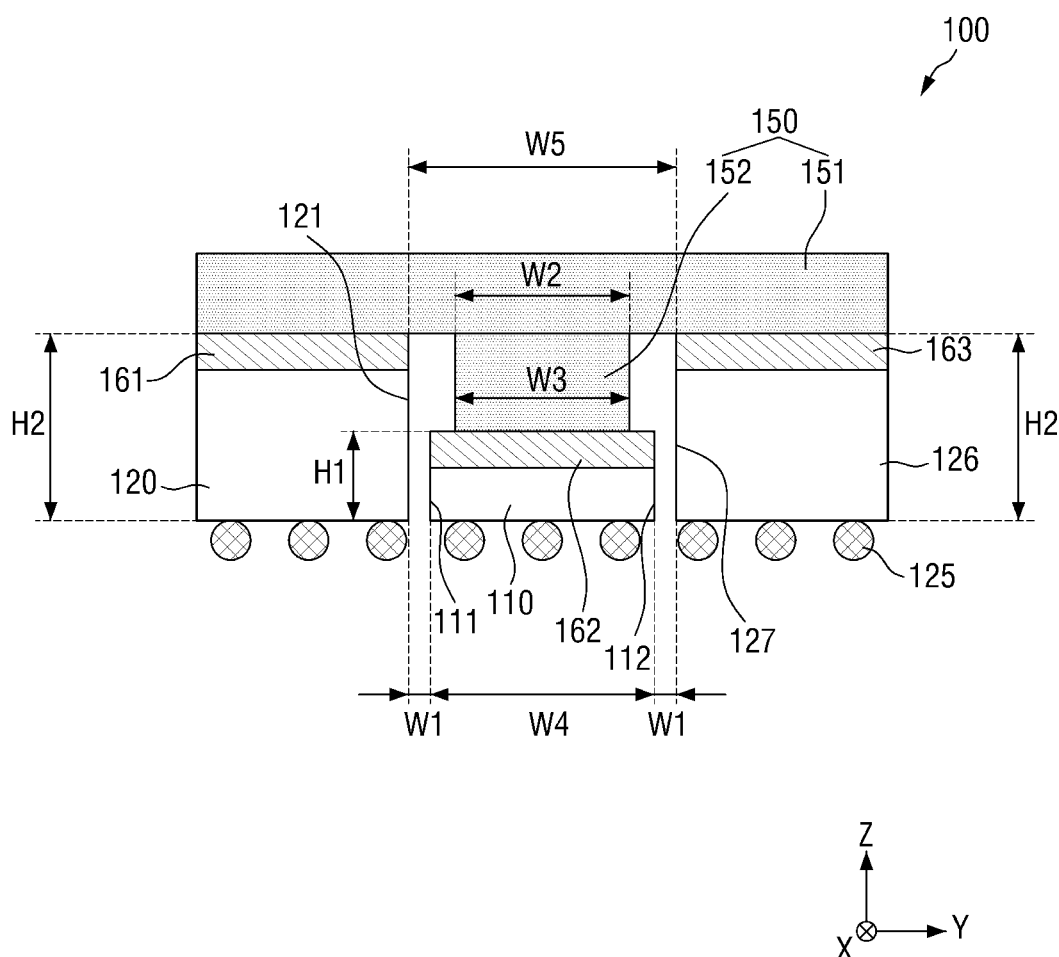
FIG. 10 is a side view of the semiconductor package according to some embodiments.
Figure 11:
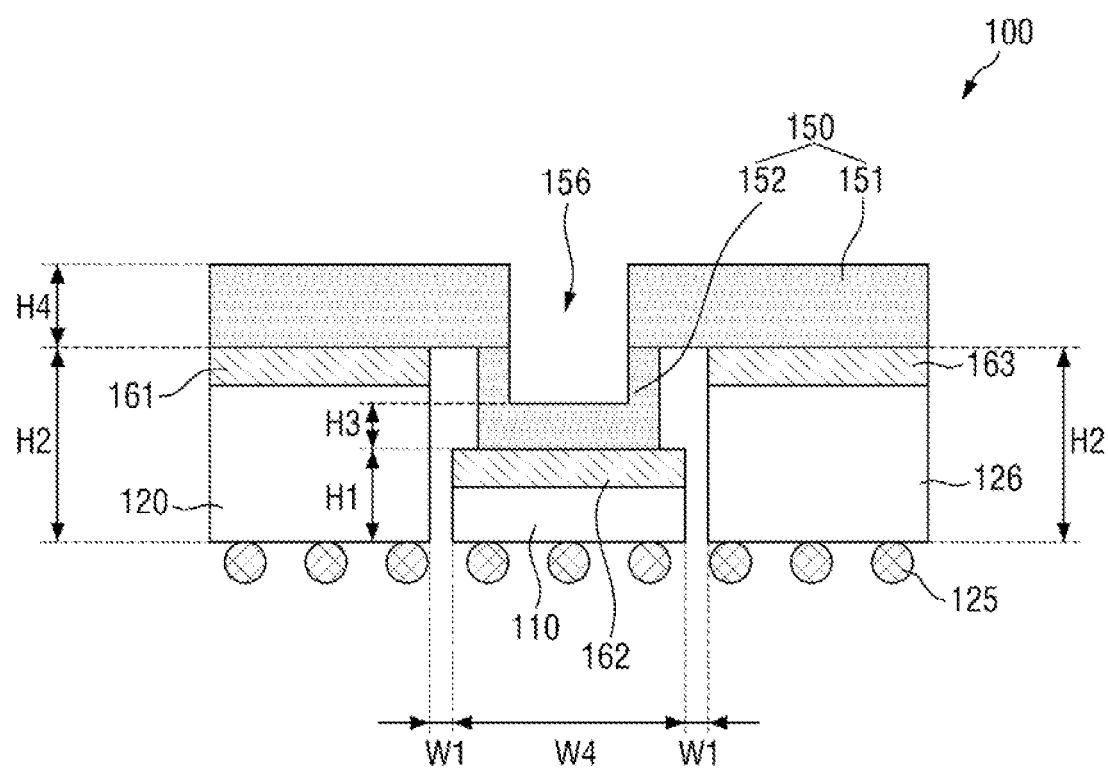
FIG. 11 is a side view of the semiconductor package according to some embodiments.
Figure 11:
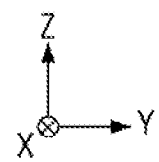

FIG. 8 is a side view of a semiconductor package according to some embodiments. FIG. 9 is a side view of the semiconductor package according to some embodiments. FIG. 10 is a side view of the semiconductor package according to some embodiments. FIG. 11 is a side view of the semiconductor package according to some embodiments.

Referring to FIG. 8, the first semiconductor chip 110 and the second heat transfer component 162 may have a first thickness H1 which is a thickness in the third direction Z. The second semiconductor chip 120 and the first heat transfer component 161 may have a second thickness H2 that is a thickness in the third direction Z. The third semiconductor chip 126 and third heat transfer component 163 may have a second thickness H2 that is a thickness in the third direction Z.

Although FIG. 8 shows that the thickness in the third direction Z of the second semiconductor chip 120 and the first heat transfer component 161 is the same as the thickness in the third direction Z of the third semiconductor chip 126 and the third heat transfer component 163, embodiments are not limited thereto, and in some embodiments, the thicknesses may be different.

The second thickness H2 may be greater than the first thickness H1.

The thickness of the second heat spreader 152 in the third direction Z may be the same as a difference between the second thickness H2 and the first thickness H1. However, embodiments are not limited thereto, and in some embodiments, the thickness of the second heat spreader 152 in the third direction Z may be smaller than a difference between the second thickness H2 and the first thickness H1.

The second width W2, which is the width in the second direction Y of the interface between the first heat spreader 151 and the second heat spreader 152, may be smaller than the fifth width W5 which is the distance between an inner side wall of the first heat transfer component 161 in the second direction Y and an inner side wall of the third heat transfer component 163 in the direction opposite to the second direction Y. Further, the second width W2 may be smaller than the fifth width W5, which is the distance in the second direction Y between the third side wall 121 of the second semiconductor chip 120 and the fourth side wall 127 of the third semiconductor chip 126.

Since the second width W2 is smaller than the fifth width W5, when the heat spreader 150 is mounted on the semiconductor package, the second heat spreader 152 may not collide with the second semiconductor chip 120 and the third semiconductor chip 126. That is, when the heat spreader 150 is mounted on the semiconductor package, the second heat spreader 152 may not collide with the third side wall 121 and the fourth side wall 127.

Further, since the second width W2 is smaller than the fifth width W5, it is possible to prevent the heat spreader 150 from incompletely coming into contact with the first heat transfer component 161, the second heat transfer component 162, the third heat transfer component 163 of the semiconductor package. Therefore, the product reliability of the semiconductor package may be improved.

Although FIG. 8 shows that the second width W2 is smaller than the fifth width W5, an area of the interface between the first heat spreader 151 and the second heat spreader 152 may be smaller than an area of the space between the third side wall 121 and the fourth side wall 127, as seen from a top view of the semiconductor package. That is, referring to FIG. 3, the area of the space between the third side wall 121 and the fourth side wall 127 may be greater than the area of the interface between the first heat spreader 151 and the second heat spreader 152. Also, referring to FIG. 5, the area of the space between the first heat transfer component 161 and the third heat transfer component 163 may be greater than the area of the interface between the first heat spreader 151 and the second heat spreader 152.

Referring again to FIG. 8, the third width W3, which is the width in the second direction Y of the lower surface of the second heat spreader 152, may be greater than the second width W2. That is, the second heat spreader 152 may have a trapezoidal shape that becomes wider toward the lower part (i.e., as a distance from the first heat spreader 151 increases) when viewed in the first direction. Further, an area of the lower surface of the second heat spreader 152 may be greater than an area of the interface between the first heat spreader 151 and the second heat spreader 152.

The lower surface of the second heat spreader 152 may cover the upper surface of the second heat transfer component 162. That is, the third width W3 may be equal to the fourth width W4 of the second heat transfer component 162 in the second direction Y. However, embodiments are not limited thereto. In some embodiments, the third width W3, which is the width in the second direction Y of the lower surface of the second heat spreader 152, may be smaller than the fourth width W4 of the second heat transfer component 162 in the second direction Y. Also, the area of the lower surface of the second heat spreader 152 may be equal to the area of the upper surface of the second heat transfer component 162. However, embodiments are not limited thereto, and in some embodiments, the area of the lower surface of the second heat spreader 152 may be smaller than the area of the upper surface of the second heat transfer component 162.

The second heat spreader 152 may be spaced apart from and may not be in contact with the third side wall 121 of the second semiconductor chip 120, the fourth side wall 127 of the third semiconductor chip 126, the side wall of the first heat transfer component 161, and the side wall of the third heat transfer component 163.

FIG. 9 is a side view of a semiconductor package according to some embodiments. Repeated description of like elements will be omitted for conciseness, and differences from the above-described embodiments will be mainly explained below.

In the embodiment illustrated in FIG. 9, the third width W3, which is the width in the second direction Y of the lower surface of the second heat spreader 152, may be smaller than the second width W2. That is, the second heat spreader 152 may have a trapezoidal shape that becomes narrower toward the lower part (i.e., as a distance from the first heat spreader 151 increases) when viewed in the first direction. The area of the lower surface of the second heat spreader 152 may be smaller than the area of the interface between the first heat spreader 151 and the second heat spreader 152.

Since the third width W3, which is the width in the second direction Y of the lower surface of the second heat spreader 152, is smaller than the second width W2, when the heat spreader 150 is inserted, it is possible to prevent the lower surface of the second heat spreader 152 from colliding with the second semiconductor chip 120, the third semiconductor chip 126, the first heat transfer component 161, and the third heat transfer component 163.

The lower surface of the second heat spreader 152 may cover a portion of the upper surface of the second heat transfer component 162. The third width W3, which is the width in the second direction Y of the lower surface of the second heat spreader 152, may be smaller than the fourth width W4 of the second heat transfer component 162 in the second direction Y. However, embodiments are not limited thereto.

FIG. 10 is a side view of the semiconductor package according to some embodiments. Repeated description of like elements will be omitted for conciseness, and differences from the above-described embodiments will be mainly explained below.

In the embodiment illustrated in FIG. 10, the third width W3, which is the width in the second direction Y of the lower surface of the second heat spreader 152, may be the same as the second width W2. That is, the second heat spreader 152 may have a rectangular shape in which the upper width is the same as the lower width when viewed in the first direction X. The second heat spreader 152 may have a rectangular parallelepiped shape. Further, the area of the lower surface of the second heat spreader 152 may be the same as the area of the interface between the first heat spreader 151 and the second heat spreader 152. However, embodiments are not limited thereto.

Since the third width W3, which is the width in the second direction Y of the lower surface of the second heat spreader 152, is the same as the second width W2, when the heat spreader 150 is inserted, it is possible to prevent the lower surface and the side wall of the second heat spreader 152 from colliding with the second semiconductor chip 120, the third semiconductor chip 126, the first heat transfer component 161, and the third heat transfer component 163.

FIG. 11 is a side view of a semiconductor package according to some embodiments. Repeated description of like elements will be omitted for conciseness, and differences from the above-described embodiments will be mainly explained below.

In the embodiment illustrated in FIG. 11, the heat spreader 150 may have a third thickness H3 and a fourth thickness H4. The third thickness H3 may be a thickness in the third direction Z of a portion of the second heat spreader 152 located above the first semiconductor chip 110 and the second heat transfer component 162. The thickness of at least a portion of the second heat spreader 152 located in a trench 156 (to be described below) above the first semiconductor chip 110 and the second heat transfer component 162 may be the third thickness H3. The third thickness H3 may be a thickness of the lower surface part of the second heat spreader 152 that comes into contact with the second heat transfer component 162 in the trench 156, except for a portion of the second heat spreader 152 that joins the first heat spreader 151, as illustrated in FIG. 11.

The third thickness H3 may be different from the fourth thickness H4. Referring to FIGS. 8 to 10, the third thickness H3, which is a thickness in the third direction Z of a portion of the second heat spreader 152 located above the first semiconductor chip 110 and the second heat transfer component 162, may be greater than the fourth thickness H4, which is a thickness in the third direction Z of the first heat spreader 151. Referring to FIG. 11, the third thickness H3 may be smaller than the fourth thickness H4.

The heat spreader 150 may include the trench 156. Since the heat spreader 150 includes the trench 156, the third thickness H3 may be smaller than the fourth thickness H4. The sum of the first thickness H1 and the third thickness H3 may be smaller than the sum of the second thickness H2 and the fourth thickness H4. The sum of the first thickness H1 and the third thickness H3 may be smaller than the second thickness H2.

Figure 12:
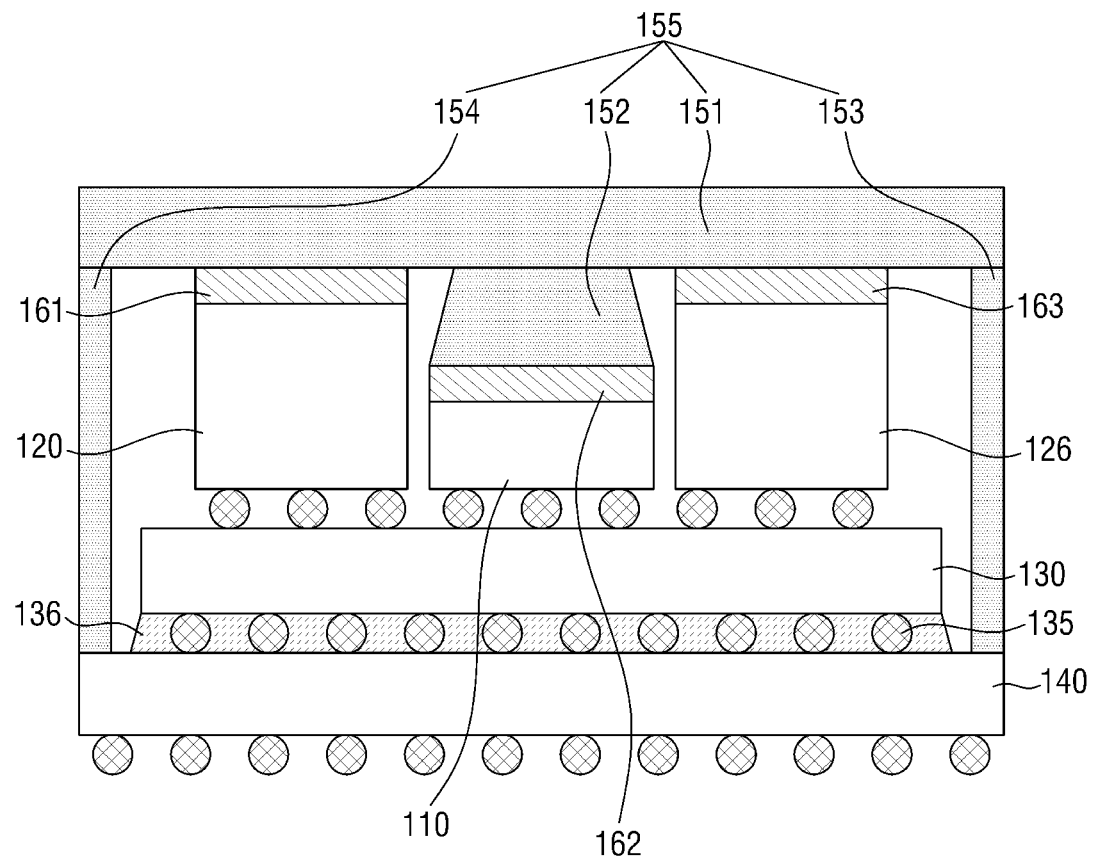
FIG. 12 is a side view of the semiconductor package according to some embodiments.
Figure 12:
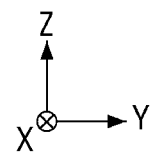

FIG. 12 is a side view of the semiconductor package according to some embodiments. Repeated description of like elements will be omitted for conciseness, and differences from the above-described embodiments will be mainly explained below.

The heat spreader 155 may include the first heat spreader 151, the second heat spreader 152, a third heat spreader 153, and a fourth heat spreader 154.

The first heat spreader 151 may have a rectangular parallelepiped shape as shown in FIG. 12. However, embodiments are not limited thereto. The first heat spreader 151 may be located above the first heat transfer component 161, the second heat transfer component 162, and the third heat transfer component 163. Further, the first heat spreader 151 may be located above the first semiconductor chip 110, the second semiconductor chip 120, and the third semiconductor chip 126.

The first heat spreader 151 may extend in the second direction Y and a direction opposite to the second direction Y. That is, the first heat spreader 151 may extend in the second direction Y beyond the upper part of the third heat transfer component 163. The first heat spreader 151 may extend in a direction opposite to the second direction Y beyond the upper part of the first heat transfer component 161. That is, the first heat spreader 151 may extend beyond outer edges of the first heat transfer component 161 and the third heat transfer component 163. The first heat spreader 151 may be located above the first substrate 130 and the second substrate 140.

The third heat spreader 153 may extend from a lower surface of the first heat spreader 151 in a direction opposite to the third direction Z, and may be in contact with the second substrate 140. The third heat spreader 153 may be disposed to be spaced apart from the side walls of the third semiconductor chip 126 and the side walls of the first substrate 130.

The fourth heat spreader 154 may extend from a lower surface of the first heat spreader 151 in a direction opposite to the third direction Z, and may be in contact with the second substrate 140. The fourth heat spreader 154 may be disposed to be spaced apart from the side walls of the second semiconductor chip 120 and the side walls of the first substrate 130.

The heat spreader 155 may be formed on the semiconductor package, and may define a packaging space between the second substrate 140 and the heat spreader 155. The first semiconductor chip 110, the second semiconductor chip 120, the third semiconductor chip 126, the first heat transfer component 161, the second heat transfer component 162, the third heat transfer component 163, the first connection terminal 125, the second connection terminal 135, the first substrate 130 and the underfill material 136 may exist in the packaging space.

Figure 13:
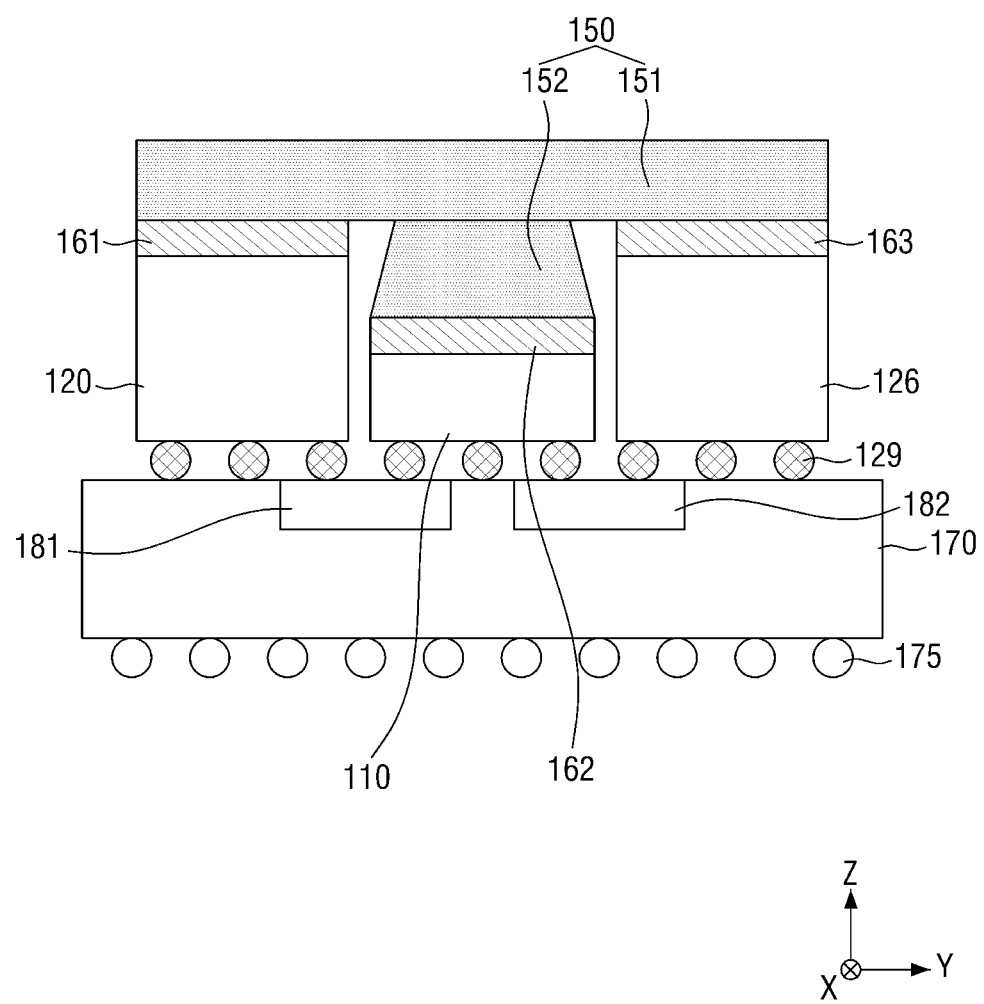
FIG. 13 is a side view of a semiconductor package according to some embodiments.

FIG. 13 is a side view of a semiconductor package according to some embodiments. Repeated description of like elements will be omitted for conciseness, and differences from the above-described embodiments will be mainly explained below. While the configuration of the second heat spreader 152 is illustrated as similar to that of FIG. 6, 8 or 12, this is only an example. In other embodiments, the second heat spreader 152 may have a configuration similar to that of FIG. 9, 10, or 11.

A semiconductor package illustrated in FIG. 13 may include a third substrate 170, a first bridge 181, a second bridge 182, a fourth connection terminal 129, a fifth connection terminal 175, the first semiconductor chip 110, the second semiconductor chip 120, the third semiconductor chip 126, the first heat transfer component 161, the second heat transfer component 162, the third heat transfer component 163, and the heat spreader 150.

The third substrate 170 may be a package substrate. For example, the third substrate 170 may be a printed circuit board (PCB), a ceramic substrate or the like.

The fourth connection terminal 129 may be disposed between the third substrate 170, the first semiconductor chip 110, the second semiconductor chip 120, and the third semiconductor chip 126. The fourth connection terminal 129 may include, but is not limited to, a plurality of solder balls or a plurality of conductive bumps.

The first bridge 181 and the second bridge 182 may be an embedded interconnect bridge (EmIB). The first bridge 181 and the second bridge 182 may include silicon (Si).

The first bridge 181 may be embedded in the third substrate 170. The upper surface of the first bridge 181 may be exposed to the upper part of the third substrate 170. The first bridge 181 may be located below at least a portion of the first semiconductor chip 110 and at least a portion of the second semiconductor chip 120. A first group of the fourth connection terminals 129 may be disposed between the second semiconductor chip 120 and the first bridge 181. A second group of the fourth connection terminals 129 may be disposed between the first semiconductor chip 110 and the first bridge 181.

The first group of the fourth connection terminals 129 may be electrically connected to the second group of the fourth connection terminals 129 through the first bridge 181. That is, the second semiconductor chip 120 and the first semiconductor chip 110 may be electrically connected through the first bridge 181.

The second bridge 182 may be embedded in the third substrate 170. The upper surface of the second bridge 182 may be exposed to the upper surface of the third substrate 170. The second bridge 182 may be located below at least a portion of the third semiconductor chip 126 and at least a portion of the second semiconductor chip 120. A third group of the fourth connection terminals 129 may be disposed between the first semiconductor chip 110 and the second bridge 182. A fourth group of the fourth connection terminals 129 may be disposed between the third semiconductor chip 126 and the second bridge 182.

The third group of the fourth connection terminals 129 may be electrically connected to the fourth group of the fourth connection terminals 129 through the second bridge 182. That is, the third semiconductor chip 126 and the first semiconductor chip 110 may be electrically connected through the second bridge 182.

The fifth connection terminal 175 may be disposed on a lower surface of the third substrate 170. The fifth connection terminal 175 may include, but is not limited to, a plurality of solder balls or a plurality of conductive bumps. The fourth connection terminal 129 and the fifth connection terminal 175 except for the first to fourth groups of the fourth connection terminal 129 may be electrically connected together through or by the third substrate 170. The semiconductor package may be electrically connected to an external device through the fifth connection terminal 175.

Those skilled in the art will appreciate from the above description that many variations and modifications may be made to the various embodiments without substantially departing from the principles set forth herein. Therefore, the various embodiments are used in a generic and descriptive sense only and not for purposes of limitation.

What is claimed is:

1. A semiconductor package comprising:
a substrate;
a first semiconductor chip, a second semiconductor chip, and a third semiconductor chip disposed on the substrate, the first semiconductor chip being disposed between the second semiconductor chip and the third semiconductor chip;
a first heat transfer component, a second heat transfer component and a third heat transfer component disposed on the second semiconductor chip, the first semiconductor chip, and the third semiconductor chip, respectively;
a first heat spreader formed on the first heat transfer component, the second heat transfer component and the third heat transfer component and directly contacting the first heat transfer component and the third heat transfer component;
a second heat spreader which protrudes from the first heat spreader and directly contacts the second heat transfer component; and
a trench formed on the second heat spreader,
wherein the first heat spreader comprising a first part and a second part which is divided by the trench,
wherein the second heat spreader is spaced apart from the second semiconductor chip and the first heat transfer component, and from the third semiconductor chip and the third heat transfer component,
wherein the second heat spreader comprises a first side unit, a second side unit and a bottom unit connecting the first side unit and the second side unit,
wherein the first side unit and the second side unit are spaced apart each other with the trench therebetween, and
wherein a distance between an outer surface of an uppermost part of the first side unit and an outer surface of an uppermost part of the second side unit is smaller than a width of an upper surface of the first semiconductor chip.

2. The semiconductor package of claim 1, wherein
a distance between an inner sidewall of the first part and an inner sidewall of the second part is smaller than the width of the upper surface of the first semiconductor chip.

3. The semiconductor package of claim 1, wherein
a width of the second heat transfer component is the same as a width of the first semiconductor chip in a direction in which the first semiconductor chip, the second semiconductor chip and the third semiconductor chip are arrayed.

4. The semiconductor package of claim 1, wherein
the first part of the first heat spreader connects with the first side unit of the second heat spreader, and
the second part of the first heat spreader connects with the second side unit of the second heat spreader.

5. The semiconductor package of claim 4, wherein
a distance between the first part of the first heat spreader and the second part of the first heat spreader is the same as a distance between the first side unit of the second heat spreader and the second side unit of the second heat spreader.

6. The semiconductor package of claim 1, wherein
a thickness of the bottom unit of the second heat spreader is smaller than a thickness of the first heat spreader.

7. The semiconductor package of claim 1, wherein
the first side unit of the second heat spreader is faced with the second semiconductor chip,
the second side unit of the second heat spreader is faced with the third semiconductor chip,
a distance between the first side unit and the second semiconductor chip is larger than a distance between the first semiconductor chip and the second semiconductor chip, and
a distance between the second side unit and the third semiconductor chip is larger than a distance between the first semiconductor chip and the third semiconductor chip.

8. The semiconductor package of claim 1, wherein
the first side unit of the second heat spreader is faced with the second semiconductor chip,
the second side unit of the second heat spreader is faced with the third semiconductor chip, and
a distance between the first side unit and the second semiconductor chip and a distance between the second side unit and the third semiconductor chip are the same.

9. The semiconductor package of claim 1, wherein
the first semiconductor chip includes a logic chip, and each of the second semiconductor chip and the third semiconductor chip includes a high bandwidth memory in which a plurality of chips are stacked respectively.

10. The semiconductor package of claim 1, wherein
an area of a bottom surface of the second heat spreader which contacts the second heat transfer component is smaller than or equal to an area of the upper surface of the first semiconductor chip.

11. A semiconductor package comprising:
a substrate;
a first semiconductor chip, a second semiconductor chip, and a third semiconductor chip disposed on the substrate, the first semiconductor chip being disposed between the second semiconductor chip and the third semiconductor chip;
a first heat transfer component, a second heat transfer component and a third heat transfer component disposed on the second semiconductor chip, the first semiconductor chip, and the third semiconductor chip, respectively;
a first heat spreader formed on the first heat transfer component, the second heat transfer component and the third heat transfer component and directly contacting the first heat transfer component and the third heat transfer component; and
a second heat spreader which protrudes from the first heat spreader and directly contacts the second heat transfer component,
wherein the second heat spreader is spaced apart from the second semiconductor chip and the first heat transfer component, and from the third semiconductor chip and the third heat transfer component,
wherein the first semiconductor chip includes a first side wall and a second side wall extending in a first direction, the first side wall and the second side wall being on opposite sides of the first semiconductor chip in a second direction intersecting the first direction,
a width of the second heat spreader at a boundary between the first heat spreader and the second heat spreader is smaller than a width of an upper surface of the first semiconductor chip in the second direction, and
a width of the second heat spreader in the second direction increases as a distance from the first heat spreader increases.

12. The semiconductor package of claim 11, wherein
a width of the second heat transfer component is the same as a width of the first semiconductor chip in the second direction.

13. The semiconductor package of claim 11, wherein
a width of a bottom surface of the second heat spreader is the same as a width of the second heat transfer component in the second direction.

14. The semiconductor package of claim 11, wherein
the second semiconductor chip includes a third side wall facing the first side wall of the first semiconductor chip,
the third semiconductor chip includes a fourth side wall facing the second side wall of the first semiconductor chip, and
a distance between the first side wall of the first semiconductor chip and the third side wall of the second semiconductor chip is the same as a distance between the second side wall of the first semiconductor chip and the fourth side wall of the third semiconductor chip.

15. The semiconductor package of claim 11, wherein
a width of a bottom surface of the second heat spreader is the same as the width of the upper surface of the first semiconductor chip in the second direction.

16. A semiconductor package comprising:
a substrate including a first surface and a second surface, the first surface and the second surface being on opposite sides of the substrate in a first direction;
a first semiconductor chip, a second semiconductor chip, and a third semiconductor chip disposed on the first surface of the substrate, the first semiconductor chip being disposed between the second semiconductor chip and the third semiconductor chip;
a first heat transfer component, a second heat transfer component and a third heat transfer component disposed on the second semiconductor chip, the first semiconductor chip, and the third semiconductor chip, respectively;
a first heat spreader formed on the first heat transfer component, the second heat transfer component and the third heat transfer component and directly contacting the first heat transfer component and the third heat transfer component;
a second heat spreader which protrudes from the first heat spreader and directly contacts the second heat transfer component;
a plurality of external terminals disposed on the second surface of the substrate;
a plurality of connection terminals disposed between the first semiconductor chip and the substrate, between the first semiconductor chip, and between the third semiconductor chip and the substrate; and
a first bridge and a second bridge disposed on the first surface of the substrate,
wherein the second heat spreader is spaced apart from the second semiconductor chip and the first heat transfer component, and from the third semiconductor chip and the third heat transfer component in the first direction,
a width of the second heat spreader at a boundary between the first heat spreader and the second heat spreader is smaller than a width of an upper surface of the first semiconductor chip in the first direction,
a first group of the plurality of connection terminals is disposed between the second semiconductor chip and the first bridge,
a second group of the plurality of connection terminals is disposed between the first semiconductor chip and the first bridge,
a third group of the plurality of connection terminals is disposed between the first semiconductor chip and the second bridge,
a fourth group of the plurality of connection terminals is disposed between the third semiconductor chip and the second bridge, and
a remainder of the plurality of connection terminals other than the first group, the second group, the third group and the fourth group are connected to a portion of the plurality of external terminals.

17. The semiconductor package of claim 16, wherein the plurality of connection terminals are spaced from each other by the same distance.

18. The semiconductor package of claim 16, wherein wherein the substrate is an interposer substrate.

19. The semiconductor package of claim 16, wherein a width of a bottom surface of the second heat spreader is the same as a width of the second heat transfer component in a second direction intersecting the first direction.

20. The semiconductor package of claim 16, wherein a width of a bottom surface of the second heat spreader is the same as the width of the upper surface of the first semiconductor chip in a second direction intersecting the first direction.

\* \* \* \* \*